United States Patent [19]

Fulcomer, Jr.

[11] Patent Number: 4,528,681

[45] Date of Patent: Jul. 9, 1985

[54] BUTTON DEPRESSION CLICK GENERATOR

[75] Inventor: Emanuel J. Fulcomer, Jr., Little Silver, N.J.

[73] Assignee: AT&T Bell Laboratories, Murray Hill, N.J.

[21] Appl. No.: 454,265

[22] Filed: Dec. 29, 1982

[51] Int. Cl.³ .................. H03K 21/32; H04M 11/00; G04F 3/06

[52] U.S. Cl. .................. 377/16; 328/129.1; 179/2 C; 179/90 K; 179/84 VF; 377/107

[58] Field of Search .................. 377/16, 49, 107; 179/2 C, 90 K, 84 VF; 328/129.1

[56] References Cited

U.S. PATENT DOCUMENTS

| | | | |
|---|---|---|---|
| 3,579,126 | 5/1971 | Paul | 377/16 |
| 4,142,177 | 2/1979 | Davis | 179/84 VF |
| 4,180,724 | 12/1979 | Councilman et al. | 377/16 |
| 4,326,256 | 4/1982 | Furumoto | 179/84 VF |
| 4,401,847 | 8/1983 | Schneider et al. | 179/38 |

Primary Examiner—John S. Heyman
Attorney, Agent, or Firm—David H. Tannenbaum

[57] ABSTRACT

When using membrane key pads, it is often desirable to provide the user with a sense that contact has been made. In this regard, there is disclosed a 1 KHz 4-bit counter which is normally held at a count just beyond the place where "ones" appear in the third bit position. When it is desired to provide an audio click, the processor resets the counter to zero and then releases the counter. The "ones" in the third bit position, which occur in four consecutive counts, control the application of the 1 KHz frequency to the mechanical sounder. By connecting the fourth bit position to the synchronous reset input, the counter stops incrementing after the four consecutive "ones" and waits for the next reset by the processor.

12 Claims, 2 Drawing Figures

FIG. 2

| COUNT # | COUNTER LEADS | | | | OPERATION |
|---|---|---|---|---|---|
| | Q4 | Q3 | Q2 | Q1 | |
| 0 | 0 | 0 | 0 | 0 | RESET |
| 1 | 0 | 0 | 0 | 1 | — |
| 2 | 0 | 0 | 1 | 0 | — |
| 3 | 0 | 0 | 1 | 1 | — |
| 4 | 0 | 1 | 0 | 0 | ENABLE 1st CYCLE OF 1000 Hz |
| 5 | 0 | 1 | 0 | 1 | |
| 6 | 0 | 1 | 1 | 0 | |
| 7 | 0 | 1 | 1 | 1 | |
| 8 | 1 | 0 | 0 | 0 | WAIT STATE |
| 9 | 1 | 0 | 0 | 1 | FORCES THE 1000 (8) COUNT |
| 10 | 1 | 0 | 1 | 0 | " |
| 11 | 1 | 0 | 1 | 1 | " |
| 12 | 1 | 1 | 0 | 0 | " |
| 13 | 1 | 1 | 0 | 1 | " |
| 14 | 1 | 1 | 1 | 0 | " |
| 15 | 1 | 1 | 1 | 1 | " |
| | 4th SIG. BIT | 3rd SIG. BIT | 2nd SIG. BIT | LEAST SIGNIFICANT BIT | |

BUTTON DEPRESSION CLICK GENERATOR

This invention relates to a device for audibly indicating to a user that a button has been depressed. More particularly, the invention is directed to a circuit for producing a fixed length distinctive repetitive clicking sound under processor control.

BACKGROUND OF THE INVENTION

There are presently on the market pushbutton switches which are designed using a flexible membrane for controlling electrical contact. These membrane switches typically do not make noise when depressed and because of the relatively slight pressure required to effect contact closure the user is not exactly sure that such contact has been made. This lack of audible feedback, coupled with low tactile feedback, is exacerbated in the situation when the result of the key operation is not otherwise communicated to the user. For example, in telecommunications equipment, it is typical for a central processor to scan the keys of many communication devices "looking" for a key push. Upon detection, the processor begins processing the information while at the same time attending to many other tasks. After a period of time the processor may then acknowledge to the user, via a lighted lamp or the provision of dial tone, that the key push had been recognized and acted upon. This recognition may only take a few tenths of a second, but since immediate positive feedback is not provided, the user may again operate the same key. Thus, it is necessary to provide a feedback mechanism to silent keys when they are used in conjunction with delayed feedback devices.

This problem is compounded in that had the processor been available to provide the desired feedback signal in the first place, it would have been provided. Thus, in situations where processor capacity is not available a feedback signal must be provided which signal must not rely on the processor for its generation. A further requirement for the feedback signal is that it should be uniform from one key push to the next and should be indicative of the fact that the key push has been processed.

SUMMARY OF THE INVENTION

I have solved these problems by arranging a click generation circuit to operate in response to a simple signal from the processor and to generate a fixed length audio signal in response thereto. I have used a four-stage synchronous binary counter with a synchronous clear lead to control the click generation signal. The processor sends a simple signal, such as a high followed by a low, and the circuit then generates the desired waveform by counting up on the counter. Certain bits of the counter are used to control the generated waveform, and other bits are used to stop the counter at a particular count. In this manner an inexpensive single signal is generated under control of a local circuit but which responds to the central processor for initiation.

BRIEF DESCRIPTION OF THE DRAWINGS

The invention and its several other objects, features and advantages will be more fully understood from a reading of the following description to one embodiment taken in conjunction with the drawing in which:

FIG. 2 is a chart of the counter states and function.

DETAILED DESCRIPTION

Figure 1:
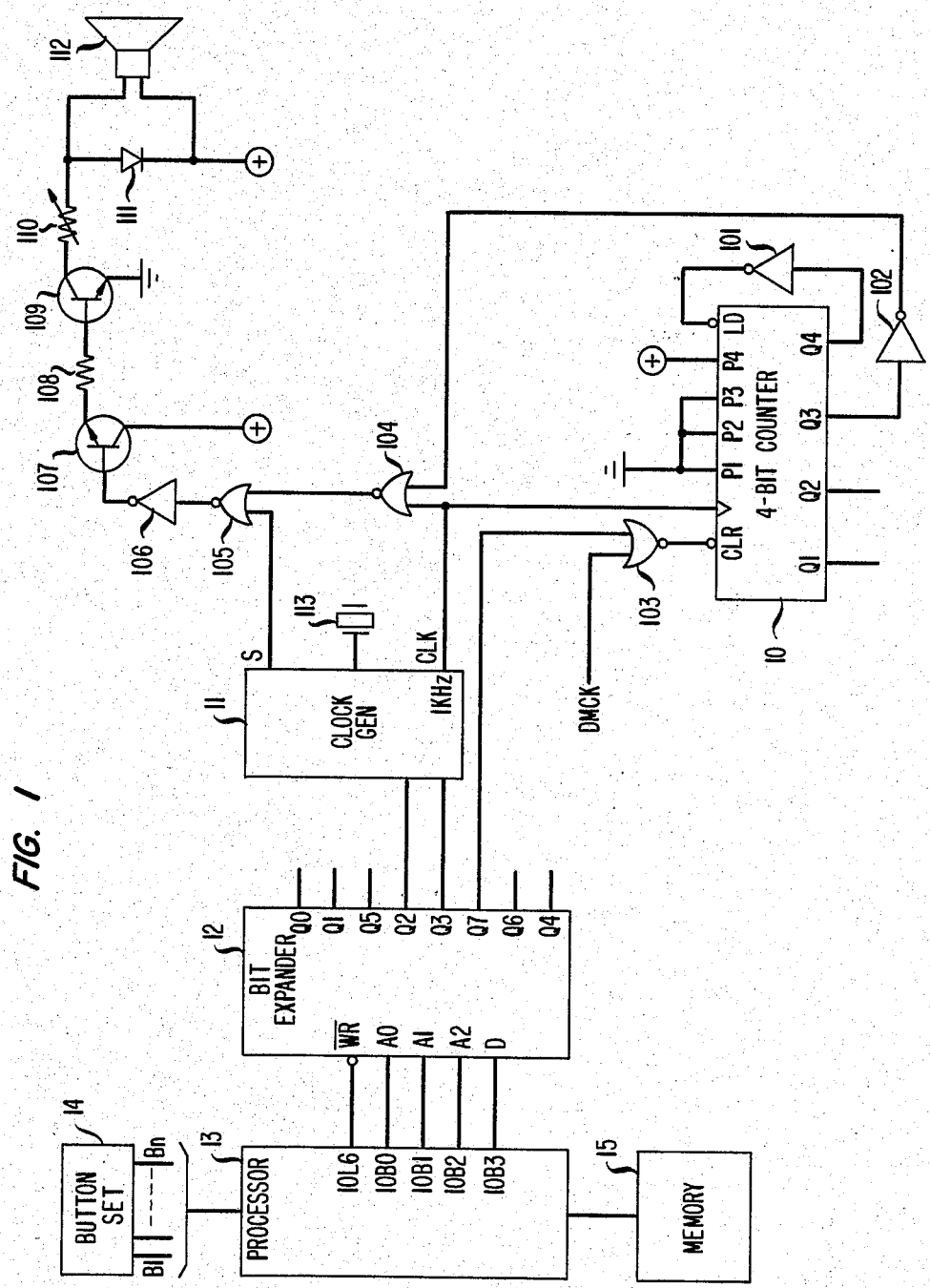
FIG. 1 shows a block diagram schematic of the invention.

As shown in FIG. 1, button set 14 which typically would be of the membrane type is operated to provide a signal on one of its output leads to processor 13 which processor may be any one of the well-known types such as, for example, Intel 8086. Processor 13 operates on the input signal from button set 14 in accordance with instructions provided by the user. Some of these instructions could, for example, cause the processor to seek other information, such as from memory 15. This would take time to accomplish especially if the processor were busy with another task. If nothing more were to be done, the person pushing the button would not have positive feedback of the button push until the task was completed. This could, in some situations, result in multiple button pushes. However, in the inventive environment one of the processor instructions is designed such that immediately upon detection of the signal from button set 14 processor 13 provides an immediate signal to bit expander 12 which in turn causes a high on output Q7 to gate 103 which in turn causes the asynchronous clear lead of 4-bit counter 10 to go low. 4-bit counter 10 is advantageously a 4-bit synchronous counter with an asynchronous clear lead (CLR) and a synchronous load (LD). The function of lead LD will be discussed hereinafter. 4-bit counter 10 may be, for example, a Motorola MC 14161B counter. Bit expander 12 may be, for example, Motorola MC 14099B latch.

It should also be noted at this point that a high signal on lead DMCK would also cause a low on the CLR lead of 4-bit counter 10. This high could come from any source, such as from a key or button directly without requiring processor intervention. Thus, lead DMCK could be connected directly to button set 14 or to any other button set such that when any button is operated, a signal would appear on lead DMCK causing a low on lead CLR of 4-bit counter 10.

The low on lead CLR of 4-bit counter 10 causes outputs Q1, Q2, Q3 and Q4 to go low (zero). The counter now begins to count in a straightforward manner on the positive transitions of a 1 KHz clock via lead CLK from clock generator 11. Clock generator 11 operates in conjunction with crystal 113 such that the frequency of the signal on lead CLK can be 1 KHz or 2 KHz or any other frequency desired.

As illustrated in FIG. 2, for counts 0, 1, 2 and 3 nothing happens since, as shown in FIG. 1, leads Q1 and Q2 are not connected. At count 4, lead Q3 (as shown in FIG. 2) goes high (1) enabling the first cycle of the 1 KHz tone. The high signal on lead Q3 (FIG. 1) is communicated via gate 102 to gate 104 and combined with the 1 KHz clock signal to form an input to NOR gate 105. Gate 105 operates to allow speaker 112 to be energized either from conventional ringing signals provided over lead S from clock generator 11 or from the combined clock signal and counter control signal. Clock lead S provides various signals under control of Q2 and Q3 from bit expander 12. These signals are continuous and under supervised processor control.

One advantage of combining the clock signal with a counter control signal generated from the same clock signal is that there is always exactly four (or the number pre-established) full clock cycles applied to the sounder for each click signal, the click signal being defined as a series of said applied clock cycles. The inverter gate 106 turns on transistor 107, thereby turning on transistor 109 and providing a pulse of current via variable resistor 110 to speaker 112. This current pulse lasts for 1 KHz and then turns off. Diode 111 functions to protect transistor 109 from transient high voltages produced by the speaker 112.

Since during the next three cycles, i.e., cycles 5, 6 and 7, output Q3 remains high (FIG. 2), gate 104 continues under control of clock lead CLK from clock generator 11. Thus, the current to speaker 112 is under control of the 1 KHz clock signal for a total of four counts or cycles (4, 5, 6 and 7) of 4-bit counter 10, thereby producing the fixed length audio sound or click.

On the next count, i.e., count 8 of 4-bit counter 10, lead Q4 goes high (FIG. 2). This is the "wait" state, and is implemented by inverting, via gate 101, the Q5 output and applying the resulting low to lead LD as the synchronous load. The low on lead LD forces the outputs Q1, Q2, Q3, and Q4 to assume the same states as the corresponding P1–P4 inputs. Thus, since leads P1, P2, P3 are low and lead P4 is high, outputs Q1, Q2, Q3 are low (0) while output Q4 goes high (1). Accordingly, the counter waits at count 8 (1000). Thus, upon a single low signal on lead CLR 4-bit counter operates to enable 4 cycles of audible tone by speaker 12, the repetitive tone signal being controlled by the clock input.

CONCLUSION

While the tone generation circuit has been shown with separate apparatus, it is to be understood that a single circuit could be designed employing the concepts of my invention. This single circuit could, for example, be incorporated within the button set as well as remote thereto. Of course, the audible tone could be replaced with any other signal, including light or magnetic signals, and the number of output bits from the counter which serve to control the enabling of the tone can be variable. In the embodiment this could be accomplished, for example, by ORing the second outputs (Q2) with the third output (Q3). Light signal outputs could be employed, for example, in the button set such that upon a button push that particular button momentarily lights.

What is claimed is:

1. A circuit for producing an audible signal output in response to a button operation, said circuit comprising
    a source of periodic signals,
    an output,
    means for counting said periodic signals,
    means for holding the count at a certain preset number of counts,
    means responsive to a reset signal received as a result of a said button operation for resetting said counting means from said preset number to another number so as to allow said counter to count said periodic signals, said counter thereby advancing from said reset number to said preset number, and
    means controlled by said advancing counter for providing an audio control signal to said output.

2. The invention set forth in claim 1 wherein said counting means includes a 4-bit binary counter having four outputs, representing the bit counts of said binary counter, said counting means arranged such that the third significant bit output controls said enabling means, and
    the fourth significant bit output controls said holding means.

3. The invention set forth in claim 2 wherein said 4-bit counter includes a synchronous load input and a plurality of forced inputs corresponding on a one-for-one basis with said bit output leads, said bit output leads assuming the same state as the state contained on the associated forced input when said synchronous load input is activated, and
    wherein the fourth significant bit output controls said activation of said synchronous load input.

4. The invention set forth in claim 2 wherein said third significant bit output controls said enabling means.

5. The invention set forth in claim 3 wherein said enabling means includes a gate for combining said periodic signals with said signal from said third significant bit output of said 4-bit counter.

6. The invention set forth in claim 1 wherein said output is an audible sounding device, and wherein said audio control signal is derived from said periodic signals.

7. A circuit for generating a selectable length output signal in response to a single input signal, said circuit comprising
    an input for receiving periodic signals,
    means for counting said periodic signals,
    means for holding said counting means at a first peset number of counts without regard to the continuation of said periodic signals,
    means controlled by said single input signal for enabling said counter to advance from a second preset number to said first preset number under control of received periodic signals, and
    means controlled by said advancing counter and operable in conjunction with said periodic signals for providing said output signal.

8. The invention set forth in claim 7 wherein said second preset number is variable thereby controlling the length of said output signal.

9. The invention set forth in claim 7 wherein said counting means includes a 4-bit binary counter having four outputs, representing the bit counts of said binary counter said counting means arranged such that the third significant bit output controls said providing means.

10. The invention set forth in claim 9 wherein the fourth significant bit output controls said holding means.

11. The invention set forth in claim 10 wherein said 4-bit counter includes a synchronous load input and a plurality of forced inputs corresponding on a one-for-one basis with said bit output leads, said bit output leads assuming the same state as the state contained on the associated forced input when said synchronous load input is activated, and
    wherein the fourth significant bit output controls said activation of said synchronous load input.

12. The invention set forth in claim 9 wherein said providing means includes a gate for combining said periodic signals with said output signal from selected ones of said bits of said 4-bit counter.

* * * * *